United States Patent
Iwase

(10) Patent No.: US 10,194,527 B2
(45) Date of Patent: Jan. 29, 2019

(54) METHOD FOR MANUFACTURING STRETCHABLE CIRCUIT BOARD AND STRETCHABLE CIRCUIT BOARD

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/685,622

(22) Filed: Aug. 24, 2017

(65) Prior Publication Data

US 2018/0077794 A1    Mar. 15, 2018

(30) Foreign Application Priority Data

Sep. 14, 2016  (JP) ................................. 2016-180022

(51) Int. Cl.
  *H05K 1/02*  (2006.01)
  *H05K 3/36*  (2006.01)
  *H05K 1/18*  (2006.01)

(52) U.S. Cl.
  CPC ........... *H05K 1/0283* (2013.01); *H05K 1/189* (2013.01); *H05K 3/361* (2013.01)

(58) Field of Classification Search
  CPC .............................. H05K 1/0283; H05K 3/363
  See application file for complete search history.

(56) References Cited

U.S. PATENT DOCUMENTS

| 2012/0314382 A1* | 12/2012 | Wesselmann | ........ H05K 1/0283 361/749 |
| 2016/0005518 A1* | 1/2016 | Daibo | ....................... H01F 6/06 505/211 |
| 2017/0354372 A1* | 12/2017 | Varadan | ............... A61B 5/0408 |

FOREIGN PATENT DOCUMENTS

| JP | 2014-162124 A | 9/2014 |
| JP | 2014-236103 A | 12/2014 |

\* cited by examiner

*Primary Examiner* — Jeremy C Norris
(74) *Attorney, Agent, or Firm* — Westerman, Hattori, Daniels & Adrian, LLP

(57) ABSTRACT

[Problem] Provided is a method for manufacturing a stretchable circuit board, which can facilitate positioning of an external terminal and a stretchable wiring, and increase manufacturing yield of a stretchable circuit board.
[Solving Mean] A stretchable circuit board is manufactured through: a step in which an external terminal 31 is formed on a main surface 33b located on one side of a film base 33; a step in which a stretchable wiring portion 55 is formed on a main surface 53a located on one side of a stretchable base 53; and a step in which the stretchable wiring portion 55 is positioned with the external terminal 31, and pressure and heat are applied to the film base 33 and the stretchable wiring portion 55 to join them, whereby the external terminal 31 and the stretchable wiring portion 55 are connected with each other.

4 Claims, 6 Drawing Sheets

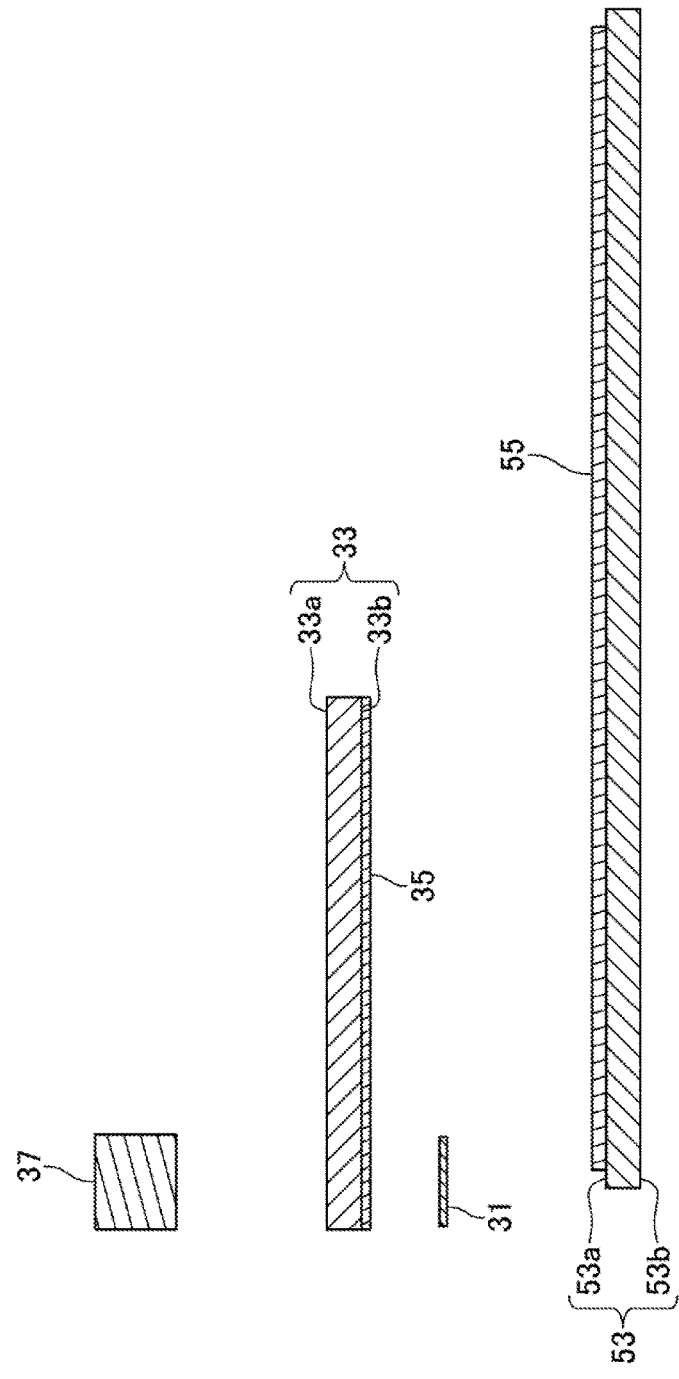

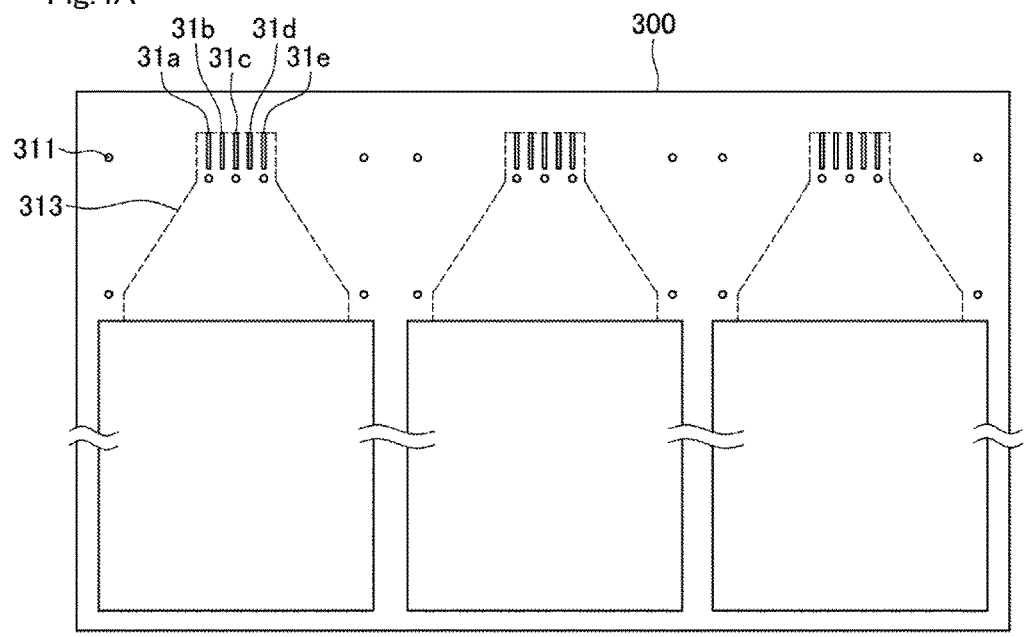
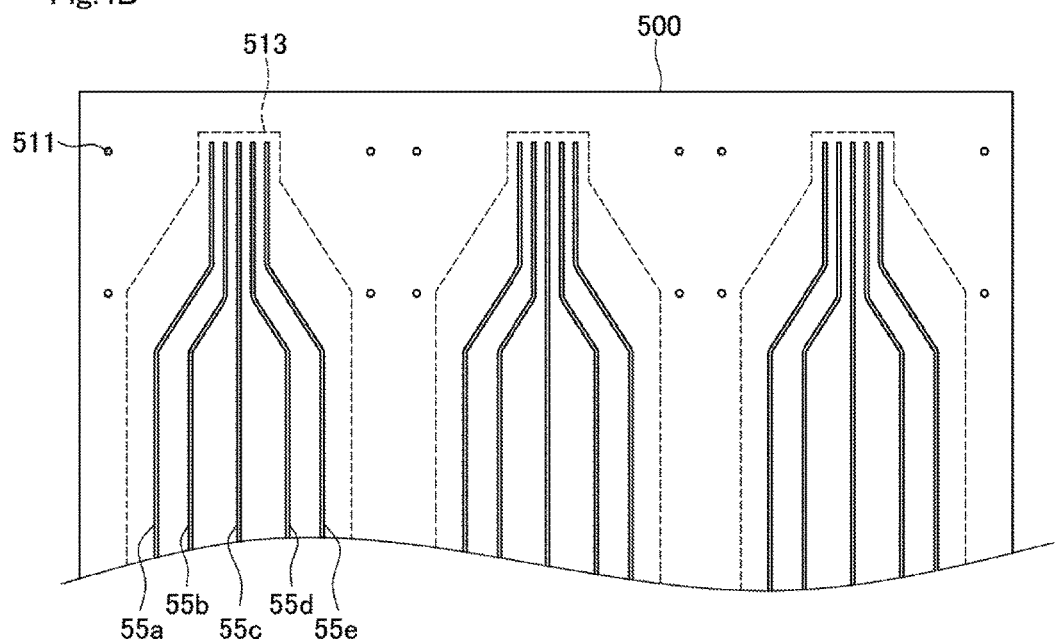

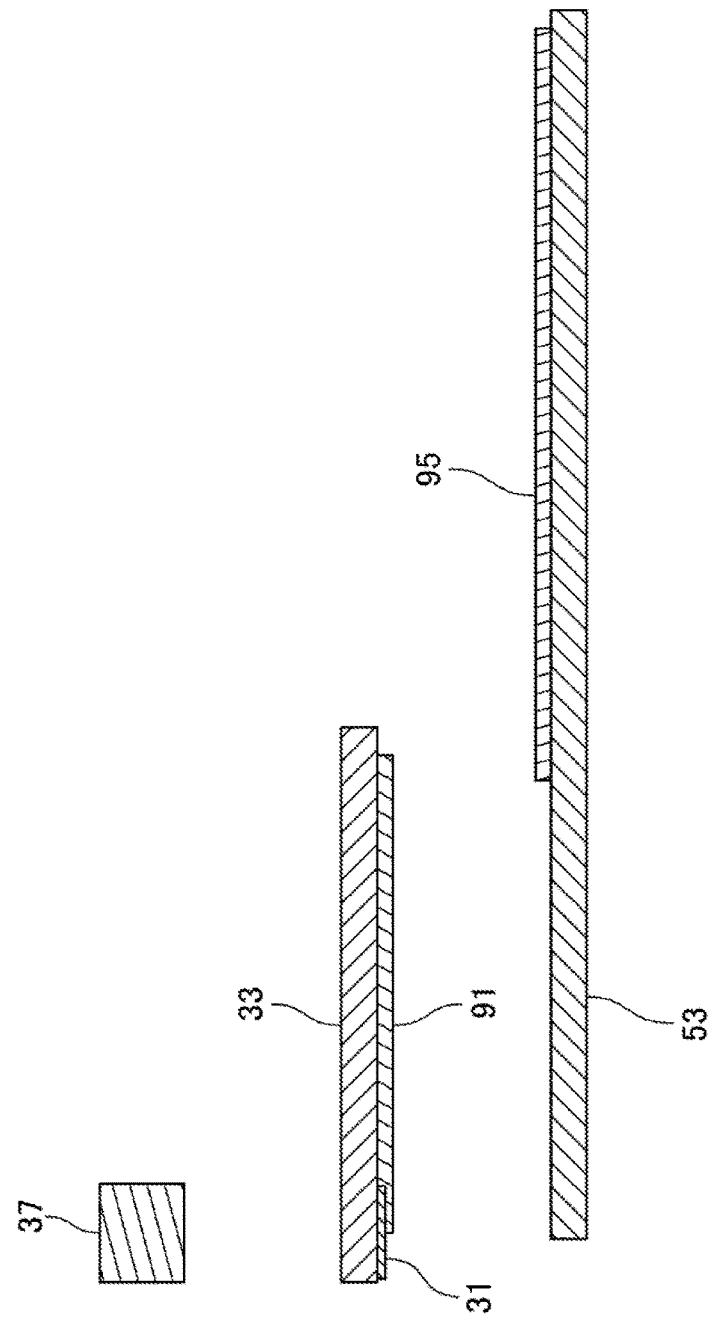

KNOWN EXAMPLE

PRESENT INVENTION

METHOD FOR MANUFACTURING STRETCHABLE CIRCUIT BOARD AND STRETCHABLE CIRCUIT BOARD

TECHNICAL FIELD

The present invention relates to methods for manufacturing a stretchable circuit board, and stretchable circuit boards.

RELATED ART

In the wearable device market and the medical device market, biological sensors and biological information monitors have received much attention in recent years. For example, the sports industry has been making an effort to quantify body movements of competitors in a highly precise manner in order to improve competitors' physical ability or skills. In such a case, wearable biological sensors that sense movement of a living body are used in some occasions. In addition, the medical industry has been detecting vital signs (biological information) such as electrocardiograms, heart rates, blood pressures, and body temperatures for the purpose of treatment of diseases or prevention against diseases. In such a case, biological information monitors may be used to detect the vital signs. In general, these biological sensors or biological information monitors are attached to garments or equipment. Then, sensing or monitoring is performed by wearing these garments or equipment.

However, as a human body moves, these garments or equipment are slightly misaligned from a body. If the biological sensor or the biological information monitor, which is provided to the garment or equipment, is misaligned from the targeted portion of a living body, the sensing accuracy or monitoring accuracy significantly deteriorates.

This problem can be alleviated by affixing the biological sensor or biological information monitor directly onto the human body. In order to affix it directly onto the human body, the biological sensor or the biological information monitor needs to be stretchable. Thus, in recent years, study has been made on stretchable electronics having a base or wiring that can stretch in in-plane directions. For the stretchable electronics, stretchable circuit boards that can stretch in association with movement of joints and the like of a human body are proposed. In a case where biological sensors or biological information monitors are used in medical application, it is desired that at least a portion of the biological sensor that is in contact with a living body or used in the vicinity of the living body should be disposable from the viewpoint of prevention of infectious diseases.

As for a known stretchable circuit board, Patent Document 1 describes a circuit board that includes a stretchable base and an electroconductive pattern containing electroconductive microparticles and elastomer. In the case of the circuit board described in Patent Document 1, the entire circuit board has stretchability. Furthermore, Patent Document 2 describes a stretchable circuit board. In this stretchable circuit board, an island made out of a material having Young's modulus higher than that of a stretchable base is embedded in the base. Embedding of the island described in Patent Document 2 is performed by forming a thin membrane through a printing method. This island has elements mounted thereon, and individual islands are connected with each other by stretchable wires. This document describes that, with this configuration in which islands are connected with each other by stretchable wires, it is possible to prevent elements from breaking or prevent breakage of wires extending over a boundary between the island and the base when the stretchable base stretches.

RELATED DOCUMENT

Patent Document

Patent Document 1: Japanese Patent Application Laid-open No. 2014-236103
Patent Document 2: Japanese Patent Application Laid-open No. 2014-162124

SUMMARY OF THE INVENTION

Problem to be Solved by the Invention

Meanwhile, the stretchable wires are connected with the external terminals for outputting signals detected by the stretchable circuit board. Since the external terminals are connected with an external device, these external terminals are made of a hard material different from that used for the stretchable wiring so as to withstand insertion/extraction performed for connection. Thus, each of the stretchable wirings and the external terminal are formed in separate steps, and then, are positioned to be connected in an electrically conductive manner. In addition, as described above, it is desired that the stretchable circuit board used as a biological sensor is disposable, and hence, the stretchable circuit board is desired to be inexpensive and be manufactured with a high volume production. The yield of a positioning process for the stretchable wiring and the external terminal to be connected with each other largely affects the yield of the stretchable circuit board, and thus, it is desired to raise the yield by reducing the degree of difficulty of the connection process.

However, in the Patent Documents described above, no description is made as to positioning between the external terminal and the stretchable wiring being taken into consideration.

The present invention has been made in view of the problems described above, and is to provide a method for manufacturing a stretchable circuit board, which can facilitate positioning of an external terminal and a stretchable wiring and increase manufacturing yield of a stretchable circuit board, and also provide the stretchable circuit board.

Means for Solving the Problem

A method for manufacturing a stretchable circuit board according to one aspect of the present invention includes:
forming a terminal portion on a main surface located on one side of a first sheet member;
forming a stretchable wiring portion on a main surface located on one side of a second sheet member having stretchability higher than that of the first sheet member; and
connecting the terminal portion and the stretchable wiring portion by positioning the terminal portion and the stretchable wiring portion, and applying pressure and heat to the first sheet member and the second sheet member to join them.

A stretchable circuit board according to another aspect of the present invention includes:
a first sheet member including a first main surface having a terminal portion formed thereon;
a second sheet member having stretchability higher than that of the first sheet member and also having a stretchable wiring portion connected with the terminal portion, the stretchable wiring portion being located on a main surface of the second sheet member facing the main surface of the first sheet member, the second sheet member being joined with the first sheet member, in which the stretchable wiring portion is a series of layers from the terminal portion to an area on the second sheet member that does not overlap with the first sheet member, and the stretchable wiring portion has a constant width when viewed from above.

Effect of the Invention

According to the method for manufacturing a stretchable circuit board according to the present invention, it is possible to provide a method for manufacturing a stretchable circuit board and a method for manufacturing a biological sensor sheet, which can facilitate positioning of an external terminal and a stretchable wiring and increase manufacturing yield of a stretchable circuit board, and further provide a stretchable circuit board.

BRIEF DESCRIPTION OF THE DRAWINGS

FIG. 3 is a sectional view taken along the long dashed short dashed line in FIG. 1.

FIGS. 4A and 4B are schematic views for explaining positioning of the external terminal and the stretchable wiring portion illustrated in FIG. 1.

FIG. 5 is a reference diagram for explaining an effect obtained from the stretchable circuit board according to the present exemplary embodiment.

DETAILED DESCRIPTION

Hereinbelow, a stretchable circuit board 100 and a method for manufacturing a stretchable circuit board according to one exemplary embodiment of the present invention will be described.

Figure 1:
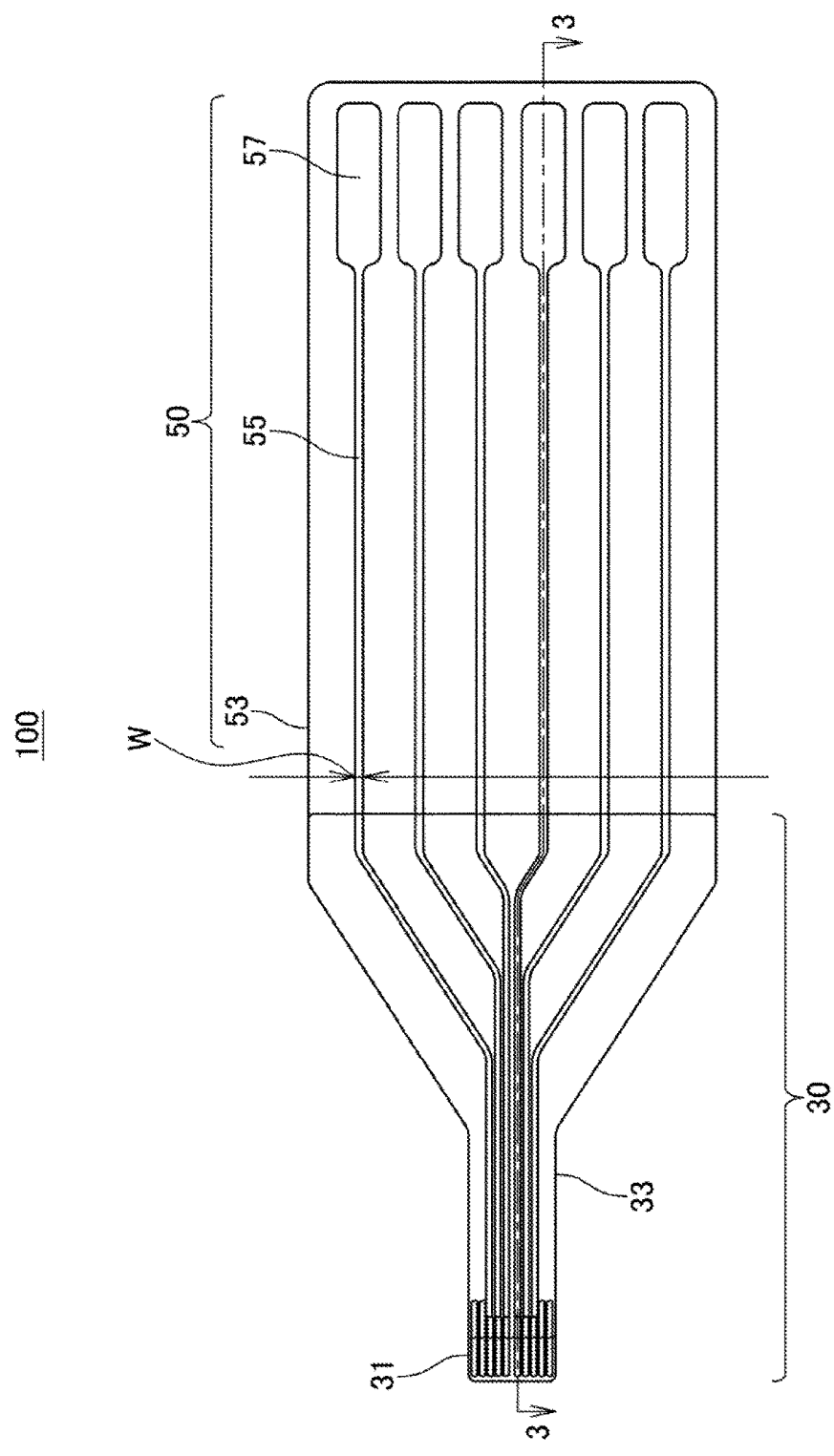
FIG. 1 is a plan view illustrating a stretchable circuit board according to an exemplary embodiment of the present invention.
Figure 2:
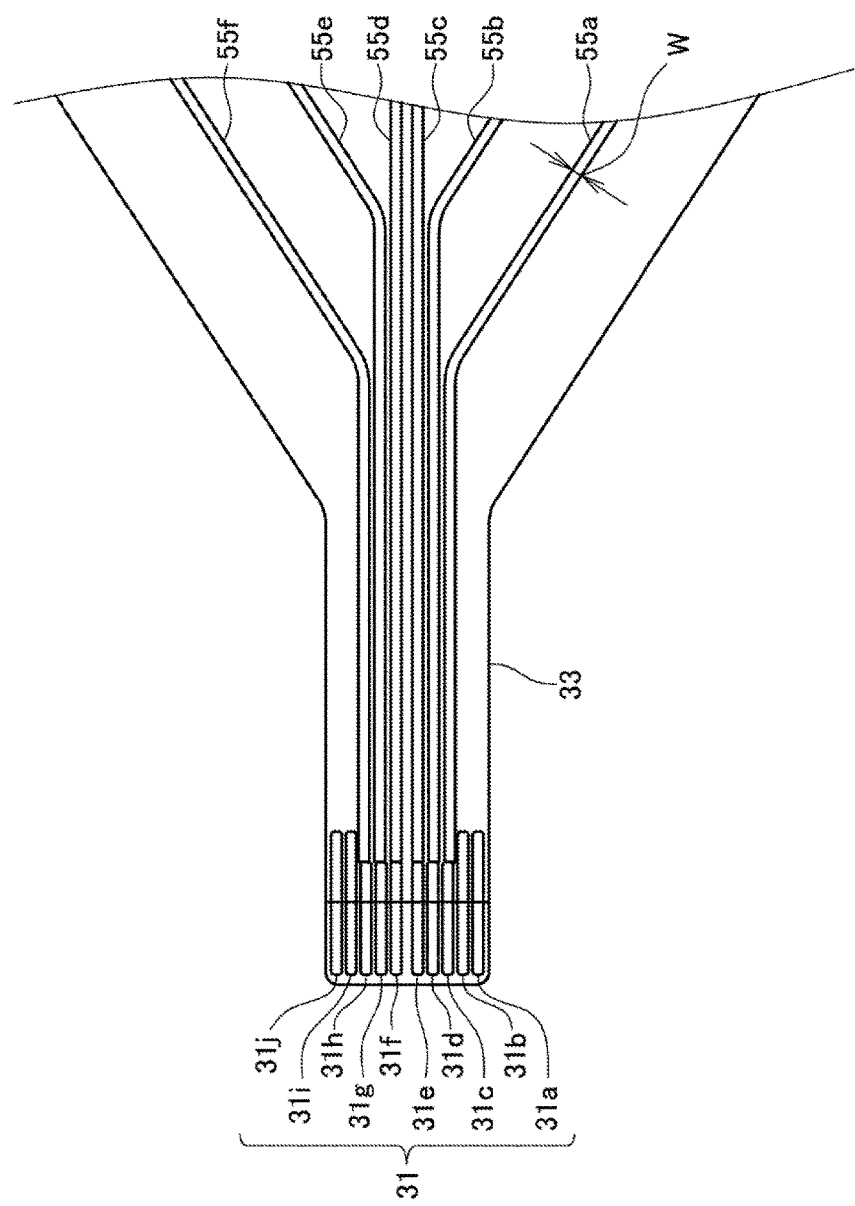
FIG. 2 is a diagram illustrating, in an enlarged manner, a part of the external terminal and the stretchable wiring portion illustrated in FIG. 1.

FIG. 1 is a top view illustrating the stretchable circuit board 100 according to the present exemplary embodiment. FIG. 2 is a diagram illustrating, in an enlarged manner, part of an external terminal 31 and a stretchable wiring portion 55 illustrated in FIG. 1. FIG. 3 is a sectional view taken along the long dashed short dashed line 3-3 of the stretchable circuit board 100 illustrated in FIG. 1. Note that, in each of the drawings, corresponding constituent components are denoted as the same reference characters, and detailed explanation thereof will not be repeated as appropriate.

It should be noted that the "plane" as used in this specification is not required to be geometrically completely flat, and is allowed to have a recessed portion or a protruding portion formed thereon. Furthermore, the "film" as used in this specification broadly includes a thing that generally has a thin thickness shape, such as a sheet and a film-shaped thing. In other words, as for the terms "sheet," "film," "film-shaped thing," and the like, difference in name does not define the thickness size of the thing.

In addition, in the following description in the present exemplary embodiment, for the purpose of convenience, the bottom side in the drawings may be called a lower surface side, and the top side may be called an upper surface side. However, these directions are defined for the purpose of convenience with the aim of illustrating relative positional relationships of constituent elements, and do not necessarily match the top or bottom in the gravity direction.

[Stretchable Circuit Board]

The stretchable circuit board 100 according to the present exemplary embodiment includes a first sheet member having an external terminal 31, which serves as a terminal portion, formed on a first main surface of the first sheet member. In the present exemplary embodiment, the first sheet member is referred to as a film base 33. In addition, in the film base 33, the main surface having the external terminal 31 formed thereon is referred to as a main surface 33b, and the back surface relative to the main surface 33b is referred to as a main surface 33a.

The stretchable circuit board 100 according to the present exemplary embodiment further includes a second sheet member having stretchability higher than that of the film base 33. The second sheet member includes a main surface facing the main surface 33b of the film base 33, and on this main surface of the second sheet member, the stretchable wiring portion 55 that is to be connected with the external terminal 31 is formed. The second sheet member is to be joined with the film base 33. In the present exemplary embodiment, the second sheet member is, hereinafter, referred to as a stretchable base 53, and a surface of the stretchable base 53 on which the stretchable wiring portion 55 is formed is referred to as a main surface 53a. In addition, the back surface relative to the main surface 53a is referred to as a main surface 53b. The stretchable wiring portion 55 is a series of layers from the external terminal 31 to the stretchable area 50 (up to a stretchable electrode 57 in FIG. 1) that is an area on the stretchable base 53 and does not overlap with the film base 33. The stretchable wiring portion 55 has a width W that is constant when viewed from above.

In the description above, the "main surface" represents a surface having an area significantly greater than other surfaces of the surfaces of the thin sheet. As the circuit board is a thin sheet, there exists a surface on the back surface of the main surface, which has an area similar to that of the main surface, and in the present exemplary embodiment, this back surface is also regarded as the "main surface." In addition, the term "series of layers" as used in the present exemplary embodiment represents continuous layers that are formed through a single process and are made out of one single member. In particular, in the present exemplary embodiment, the term "series of layers" represents layers that do not include a "seam" between different layers. Moreover, the expression "has a width that is constant" represents that the length of the stretchable wiring portion 55 in the width direction is constant, and no pattern of land or teardrop for connecting wirings with each other exists on the wire.

After this, in the present exemplary embodiment, a portion of the stretchable circuit board 100 including the film base 33 is referred to as a "reinforcement area" 30 as illustrated in FIG. 1. Furthermore, the stretchable wiring portion 55 is connected with the stretchable electrode 57 at an end portion of the stretchable wiring portion 55 that is different from an end portion connected with the external terminal 31. After this, in the present exemplary embodiment, the stretchable base 53, the stretchable wiring portion 55, and the stretchable electrode 57 are referred to as a "stretchable area" 50. As illustrated in FIG. 1, a reinforcing member 37 for adjusting the thickness of the base at and in the vicinity of the external terminal 31 to enhance the fitting property when the external terminal 31 is connected with an external device or substrate (not illustrated) via a connector is provided at a position located on the main surface 33a of the film base 33 and corresponding to the external terminal 31.

Below, the configuration described above will be sequentially described.

(Film Base)

The film base 33 is a member having flexibility, and has Young's modulus greater than that of the stretchable base 53. Note that, in the present exemplary embodiment, the film base 33 has stretchability lower than that of the stretchable base 53, and is a member that substantially does not stretch. There is no particular limitation as to the material of the film base 33. However, it may be possible to use a synthetic resin having a low sliding resistance property, corrosion resistance, and increased strength, such as polyethylene terephthalate (PET), polyethylene naphthalate (PEN), polyimide (PI), polyphenylene sulfide (PPS), and fluorocarbon resin. In addition, for the film base 33, it may be possible to use a paper base material having appropriate durability such as a cellulose nanofibers paper.

The thickness of the film base 33 may be set to be not less than 10 μm and not more than 200 μm, desirably to be not less than 25 μm and not more than 150 μm, and more desirably to be not less than 50 μm and not more than 100 μm. Furthermore, it is preferable that the thickness of the film base 33 is larger than that of the stretchable base 53. By setting the thickness of the film base 33 so as to fall in the range described above, it is possible to sufficiently increase in-plane rigidity of the reinforcement area 30, and reduce the entire thickness of the stretchable circuit board 100.

(Stretchable Base)

The stretchable base 53 has stretchability higher than that of the film base 33. A preferable base material forming the stretchable base 53 includes an elastomer material such as nitrile rubber, latex rubber, urethane-based elastomer, and silicone-based elastomer. However, the base material is not limited to these materials. In particular, by employing a urethane-based elastomer sheet used in medical application, it is possible to enhance safety even in the case where it is attached on the skin of a human body.

No particular limitation is applied to the thickness of the stretchable base 53. However, it is preferable that the thickness is, for example, not more than 100 μm from the viewpoint of not blocking stretching movements of a target (target surface) to which the stretchable circuit board 100 is applied. More desirably, the thickness of the stretchable base 53 is not more than 25 μm, and still more desirably, is not more than 10 μm.

It is preferable that the stretchable base 53 has the maximum elongation percentage of not less than 10%, more preferably, of not less than 50%, still more preferably, of not less than 100%, and still more preferably, of not less than 200%. If the stretchable base 53 is made from the base material described above, it is possible to achieve the maximum elongation percentage, for example, of not less than 300%. Here, the maximum elongation percentage of the stretchable base 53 represents the maximum value of elongation percentage in terms of elastic deformation in one direction in in-plane directions.

It should be noted that the elongation percentage as used in this specification represents a ratio of elongation in one direction in in-plane directions caused by application of force relative to the size in the case where no external force is applied (size at the time of elongation percentage of 0%). For example, in the case of the elongation percentage of 50%, the size of the substance is 1.5 times the size at the time of the elongation percentage of 0%. In the case of the elongation percentage of 100%, the size of the substance is twice the size at the time of elongation percentage of 0%.

(Stretchable Wiring Portion)

As illustrated in FIG. 2, the external terminal 31 includes plural terminal portions 31a to 31j (10 terminal portions in the present exemplary embodiment). In addition, the stretchable wiring portion 55 includes plural wiring portions 55a to 55f (six wiring portions in the present exemplary embodiment). In the present exemplary embodiment, the terminal portions are connected directly with the wiring portions, respectively, on a one-by-one basis. In the example illustrated in FIG. 2, the wiring portion 55a is positioned and joined with the terminal portion 31c. Similarly, the wiring portion 55b is positioned and joined with the terminal portion 31d; the wiring portion 55c is positioned and joined with the terminal portion 31e; and the wiring portion 55d is positioned and joined with the terminal portion 31f. In addition, the wiring portion 55e is positioned and joined with the terminal portion 31g; and the wiring portion 55f is positioned and joined with the terminal portion 31h. The specific method for positioning of the terminal portion and the wiring portion will be described later in detail.

This joining of the terminal portion and the wiring portion is performed, for example, through laminate connection or application of pressure.

The thickness size and the width size of the stretchable wiring portion 55 may be determined on the basis of resistivity of the stretchable wiring portion 55 at no load, a change in resistance of the stretchable base 53 when it is stretched, and restriction on the thickness size and the width size of the entire stretchable circuit board 100. The width size of the stretchable wiring portion 55 is set preferably to not more than 1000 μm, more preferably to not more than 500 μm, still more preferably to not more than 200 μm, from the viewpoint that the stretchable wiring portion 55 can follow a change in sizes of the stretchable base 53 at the time of stretching to achieve favorable stretchability. The thickness size of each wire constituting the stretchable wiring portion 55 may be set to not more than 25 μm, and be set desirably to be not less than 10 μm and not more than 15 μm.

(Protection Layer)

Furthermore, the stretchable circuit board 100 according to the present exemplary embodiment includes a protection layer, not illustrated, on the reinforcement area 30 and the stretchable area 50 illustrated in FIG. 1. The protection layer is a sheet-shaped cover that has stretchability and covers a surface where the stretchable wiring portion 55, which is formed on the main surface 53a of the stretchable base 53, is formed. The protection layer according to the present exemplary embodiment is formed so as to have a size that not only extends over the stretchable area 50 but also reaches the reinforcement area 30, and covers the main surface 33a of the film base 33.

With the protection layer being provided, it is possible to cause the entire stretchable base 53 to stretch in a relatively uniform manner in the case where the stretchable circuit board 100 is stretched in in-plane directions, and also to reduce occurrence of breaking of the stretchable wiring portion 55. Furthermore, since the protection layer is formed so as to extend over the stretchable area 50 and the reinforcement area 30, the stress concentration occurring on the end edge of the protection layer is distributed by the reinforcement area 30, and hence, it is possible to further reduce the occurrence of breaking of the stretchable wiring portion 55. In addition, since the stretchable wiring portion 55 is sandwiched in the thickness direction between the protection layer and the stretchable base 53, the stretchable wiring portion 55 in the stretchable area 50 is positioned substantially at the center of the stretchable circuit board 100 in the thickness direction. Thus, when the stretchable circuit board 100 is bent in the surface-normal direction, the tensile stress and the compressive stress acting on the stretchable wiring portion 55 are canceled, so that the stretchable wiring portion 55 can be protected.

It is preferable that the protection layer is made from an insulating material having stretchability. For example, an elastomer material may be used for the protection layer, and it may be possible to use the same resin material as that used for the stretchable base 53. With this configuration, it is possible to protect the stretchable wiring portion 55 without deteriorating stretchability of the stretchable area 50 of the stretchable circuit board 100. The protection layer can be manufactured by applying an elastomer-based paste to the film base 33 and the stretchable base 53 and drying them. Alternatively, it may be possible to affix the protection layer, which has been formed into a sheet shape in advance, onto the film base 33 and the stretchable base 53, or it may be possible to join them using an adhesive.

There is not particular limitation as to the thickness of the protection layer. However, the thickness of the protection layer is set preferably to not more than 100 μm, more preferably to not more than 50 μm, and still more preferably to not more than 30 μm from the viewpoint of avoiding restriction to stretchability of the stretchable circuit board 100.

[Method for Manufacturing Stretchable Circuit Board]

Next, a method for manufacturing a stretchable circuit board according to the present exemplary embodiment will be described.

As illustrated in FIG. 3, the method for manufacturing a stretchable circuit board according to the present exemplary embodiment includes: a terminal forming step in which the external terminal 31 is formed on the main surface 33b located on one side of the film base 33; a wiring forming step in which the stretchable wiring portion 55 is formed on the main surface 53a located on one side of the stretchable base 53; and a joining step in which the external terminal 31 and the stretchable wiring portion 55 are positioned, and pressure and heat are applied to the film base 33 and the stretchable base 53 to join them, whereby the external terminal 31 and the stretchable wiring portion 55 are connected with each other.

In the present exemplary embodiment, an adhesive enhancing layer 35 is formed on the entire main surface 33b of the film base 33. The adhesive enhancing layer 35 is a thin membrane formed by applying the same material as that of the stretchable base 53, and is disposed between the main surface 33b and the stretchable wiring portion 55 for the purpose of enhancing the joining strength between the main surface 33b and the stretchable wiring portion 55. Next, the external terminal 31 is formed on the main surface 33b through the adhesive enhancing layer 35. The external terminal 31 can be manufactured by layering an electrically conductive coat having wear resistance such as a carbon paste. The layering of carbon paste can be performed, for example, by a printing method. In the printing method, carbon paste containing an electrically conductive material is applied to the main surface 33b of the film base 33 so as to match the pattern including terminal portions 31a to 31j, and then, is dried or subjected to solidifying reaction for a predetermined period of time at predetermined temperatures to be cured. Since the carbon paste employs carbon, which is non-metal, as electrically conductive particles, reduction in occurrence of ion migration and improvement in wear resistance can be expected.

Meanwhile, the stretchable wiring portion 55 is formed on the main surface 53a of the stretchable base 53. The stretchable wiring portion 55 is configured to contain an electrically conductive material and has electrical conductivity. For the electrically conductive material forming the stretchable wiring portion 55, it may be possible to select a material having preferable electrical conductivity such as silver, gold, platinum, carbon, copper, aluminum, cobalt, and nickel, or an alloy thereof. The shape of the electrically conductive material is not particularly limited. However, it may be possible to use a particle-like shape such as a granule and powder. There is no particular limitation to the shape of the particle. However, it may be possible to use a spherical shape, a needle shape, a flake shape, a nanowire shape, or the like.

It is preferable that the stretchable wiring portion 55 further contains a resin binder. More specifically, the stretchable wiring portion 55 according to the present exemplary embodiment is made from an electrically conductive material prepared in a manner such that electrically conductive particles are dispersed in a resin material. Since the stretchable wiring portion 55 contains a resin binder, it is possible to reduce the occurrence of breaking of the stretchable wiring portion 55 due to stretching of the stretchable base 53. The resin binder includes, for example, a thermoplastic elastomer material such as a urethane resin binder and an acrylic resin binder. However, the resin binder is not limited to these materials. It is desirable to select a resin binder having reduced Young's modulus so that the elastic modulus of the stretchable wiring portion 55 in a filmed state is less than or equal to that of the stretchable base 53. One type of elastomer material may be used for the resin binder, or plural types of elastomer materials may be mixed and be used.

There is no particular limitation as to the method of forming the stretchable wiring portion 55. However, the stretchable wiring portion 55 can be formed, for example, through a printing method. More specifically, the stretchable wiring portion 55 according to the present exemplary embodiment is a printed pattern formed by printing and applying an electroconductive paste having stretchability. This printed pattern is formed through, after coating it with the electroconductive paste, heating the electroconductive paste for a predetermined period of time, and drying it to be cured.

Although there is no particular limitation as to a specific printing method, examples of the printing method include a screen printing method, an inkjet printing method, a gravure printing method, and an offset printing method. Of these methods, screen printing is preferably used from the viewpoint of fine resolution or stability in thick membrane. In the screen printing, in order to prevent the electroconductive paste from rising at the start portion of application, it may be possible to form the stretchable wiring portion 55 by applying the electroconductive paste to the entire main surface 53a through the screen printing, and then, applying patterning to the applied paste through lithography.

In the case where the stretchable wiring 55 is formed through the printing method, it is preferable to prepare an electroconductive paste containing the electrically conductive particle, the resin binder, each of which has been described above, and an organic solvent, and use the prepared one in the printing method. By using an electroconductive paste having stretchability and containing metal particle such as silver as the primary component to form the stretchable wiring portion 55, it is possible to achieve the elongation percentage, for example, of approximately not less than 50% and not more than 70%, and also form a wiring that exhibits an excellent stretching property.

Next, positioning of the external terminal 31 and the stretchable wiring portion 55 will be described.

FIGS. 4A and 4B are schematic views for explaining positioning of the external terminal 31 and the stretchable wiring portion 55. FIG. 4A illustrates a film base sheet 300 before cut, and FIG. 4B illustrates a stretchable base sheet 500 before cut. A pattern 313 indicated with the dashed line in the film base sheet 300 shows an assumed area indicating the shape to be die cut. The terminal portions 31a to 31e are formed on the pattern 313. Pin holes 311 into which positioning pins are to be inserted are formed inside or in the vicinity of the pattern 313.

In addition, a pattern 513 indicated with the dashed line in the stretchable base sheet 500 shows an assumed area indicating the shape to be die cut. The wiring portions 55a to 55e of the stretchable wiring portion 55 are formed on the pattern 513. Pin holes 511 into which positioning pins are to be inserted are formed outside of the area of the pattern 513.

Since the stretchable base sheet 500 and the film base sheet 300 have different thermal shrinkage rates, they shrink at rates different from each other. Naturally, in the present exemplary embodiment, the pattern 313 and the pattern 513 are designed by taking this difference in a thermal shrinkage rate into consideration.

In the present exemplary embodiment, openings are first formed in the film base sheet 300 through processing such as die cutting in a manner such that the entire stretchable area 50 including the stretchable wiring portion 55 formed on the stretchable base sheet 500 is exposed after the film base sheet 300 is joined with the stretchable base sheet 500. After this, the thus obtained film base sheet 300 is placed (set) on the working surface of a working bench (not illustrated). The working surface is provided with pins that are allowed to move up and down, and these pins are penetrated through the pin holes 311 to lock the pattern 313.

Next, in the present exemplary embodiment, the stretchable base sheet 500 is set so as to overlap with the film base sheet 300. At this time, the film base sheet 300 and the stretchable base sheet 500 are arrange in a face-to-face manner so that the terminal portion 31 formed on the film base sheet 300 faces the stretchable wiring portion 55 formed on the stretchable base sheet 500. Setting of the stretchable base sheet 500 may be performed in a state of the stretchable base sheet 500, or may be performed in a state where each pattern 513 is separated from the stretchable base sheet 500. At this time, the stretchable base sheet 500 is set in a manner such that the pins are penetrated through the pin holes 511. With this configuration, the wiring portions 55a to 55e of the pattern 513 are correctly positioned with respect to the terminal portions 31a to 31e. The allowable amount of misalignment at the time of positioning of the stretchable wiring portion 55 and the external terminal 31 according to the present exemplary embodiment falls in ±300 μm.

After positioning is performed, the external terminal 31 and the stretchable wiring portion 55 are joined with each other. This joining is performed by applying heat and pressure to the film base sheet 300 and the stretchable base sheet 500 in a state where the main surface 33b and the main surface 53a, each of which is illustrated in FIG. 3, are faced with each other. Through these steps, the main surface 33b of the film base 33 and the main surface 53a of the stretchable base 53 are directly joined with each other, and the film base 33 and the stretchable base 53 are integrally fused. Thus, the external terminal 31 and the stretchable wiring portion 55 are caused to be electrically continuous with each other.

More specifically, in the present exemplary embodiment, heat and pressure are applied to the film base 33 and the stretchable base 53 to make them fused with each other, thereby joining them. The method of heating includes a laminate method using a heating roll, and a method using heating and pressing. Application of pressure and pressing may be performed in an atmospheric condition, or may be performed in a vacuum. With this step, the film base 33 is mechanically joined using a thermal fusing property of the stretchable base 53, and the external terminal 31 is mechanically and electrically connected using a thermal fusing property of the stretchable wiring portion 55. Thus, it is possible to directly connect the external terminal 31 and the stretchable wiring portion 55 without using an adhesive or pressure-sensitive adhesive. As a result, the connection work completes in a significantly simplified manner.

Furthermore, in the present exemplary embodiment, the reinforcing member 37 is provided on the opposite side to the external terminal 31 of the reinforcement area 30. The reinforcing member 37 is a spacer member for adjusting the thickness of the distal end portion of the reinforcement area 30 so as to have the accuracy set, for example, for a connector (not illustrated) of an external device when the external terminal 31 is fitted, for example, to this connector, and is connected with this external device.

As for a material for forming the reinforcing member 37, it may be possible to use a synthetic resin having a low sliding-resistance property, corrosion resistance, and increased strength, such as PET, PEN, and PI, or it may be possible to use a paper base material. The reinforcing member 37 may be made from the same type of material as that for the film base 33, or may be made from a material that belongs to a different type from a material type for the film base 33. In addition, a thin sheet-like metal plate may be used as the reinforcing member 37. When the reinforcing member 37 is joined with the film base 33, it may be possible to use a general pressure-sensitive adhesive or adhesive.

FIG. 5 is a reference diagram illustrating another stretchable circuit board to explain an effect of the present exemplary embodiment. The configuration illustrated in FIG. 5 includes the film base 33 having the external terminal 31 and a draw-out wiring 91, the stretchable base 53 having a stretchable wiring portion 95, and the reinforcing member 37. The stretchable circuit board illustrated in FIG. 5 differs from the stretchable circuit board 100 according to the present exemplary embodiment in that the external terminal 31 and the stretchable wiring portion 95 are connected through the draw-out wiring 91. In the case of the configuration described above, the size of the film base 33 reduces due to heat applied to the film base 33 at the time of forming the external terminal 31. In addition, in the case of the configuration illustrated in FIG. 5, the draw-out wiring 91 is formed so as to be electrically and mechanically connected with the external terminal 31.

As described above, the size of the film base 33 reduces due to heat applied at the time of forming the external terminal 31. The degree of reduction in size of or change in shape of the film base 33 due to application of heat is difficult to predict. For example, in the case where plural reinforcement areas 30 (the external terminal 31 and the draw-out wiring 91) are formed in one film base sheet 300 as illustrated in FIG. 4A, it is extremely difficult to position all the external terminals 31 with corresponding draw-out wirings 91 in a highly precise manner when each of the external terminals 31 is connected with a corresponding draw-out wiring 91 through printing. As a result of present inventor's experiments, the allowable amount of misalignment of positioning of the external terminal 31 and the draw-out wiring 91 on the stretchable circuit board illustrated in FIG. 5 fell in approximately ±100 µm. This amount of misalignment is one-third of the accuracy of positioning required for the stretchable circuit board 100 according to the present exemplary embodiment illustrated in FIGS. 1 to 4. In addition, in the present exemplary embodiment, since the thermal shrinkage rate differs between the film base 33 and the stretchable base 53, it is also difficult to position the external terminal 31 and the draw-out wiring 91 of the film base 33, each of which has the size reduced and the shape changed, with the stretchable wiring portion 55 of the stretchable base 53, and join them.

With the present exemplary embodiment having the allowable amount of misalignment for positioning greater than that of the configuration illustrated in FIG. 5, it is possible to obtain yields higher than that of processes illustrated in FIG. 5 during the processes in which the external terminal 31 and the stretchable wiring portion 55 are mechanically and electrically connected with each other. Furthermore, in the case of the present exemplary embodiment, since the external terminal 31 and the stretchable wiring portion 55 are directly connected with each other, it is possible to omit the process of forming the draw-out wiring. The stretchable circuit board 100 according to the present exemplary embodiment as described above has productivity higher than that of the stretchable circuit board illustrated in FIG. 5, and is suitable for mass production. In addition, the feature of the present exemplary embodiment as described above is suitable for application used as disposable items.

Moreover, the present exemplary embodiment is particularly effective in the case where the film base 33 and the stretchable base 53 have different thermal shrinkage rates as described above.

Figure 6A:
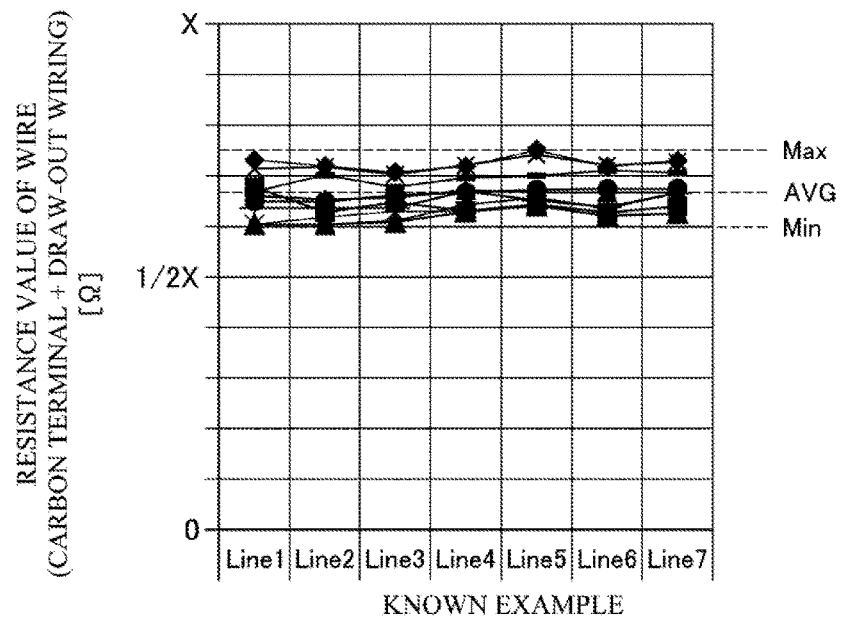
FIGS. 6A and 6B are graphs for explaining an effect obtained from the stretchable circuit board according to the present exemplary embodiment.
Figure 6B:
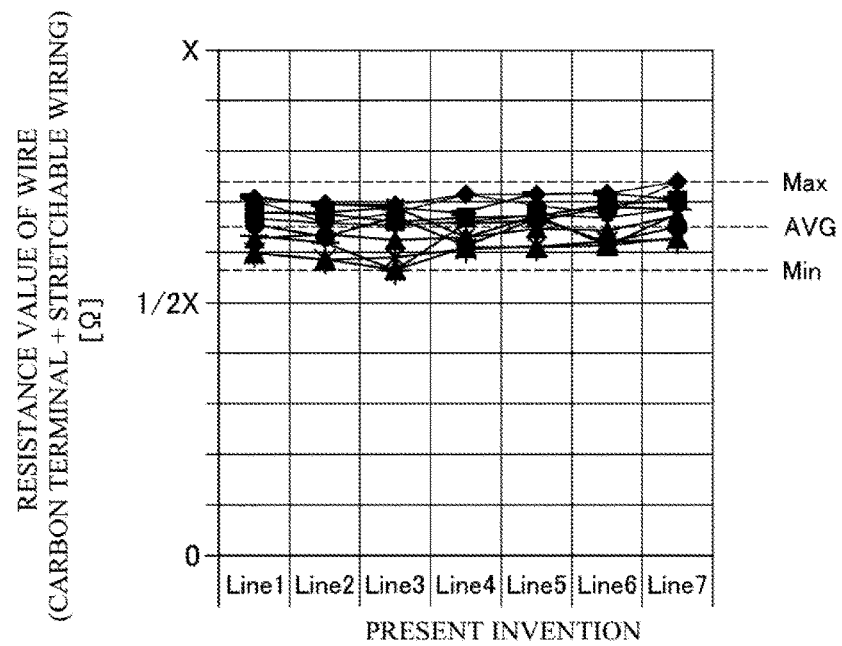

FIGS. 6A and 6B are graphs concerning the stretchable circuit board 100 according to the present exemplary embodiment and the known stretchable circuit board illustrated in FIG. 5, each showing results of measurement of resistance values from the external terminal to the stretchable electrode. Note that the vertical axes in these graphs relate to the resistance value of wires, and these values are not absolute values. The values are dimensionless factors obtained by comparing FIGS. 6A and 6B in the same range of resistance values. FIG. 6A indicates resistance values obtained through measurement in the known stretchable circuit board, and FIG. 6B indicates resistance values obtained through measurement in the stretchable circuit board 100. In each of FIGS. 6A and 6B, the vertical axis relates to measured resistance values, and the horizontal axis relates to seven wiring portions. Note that, in FIGS. 6A and 6B, the symbols "▲," "●," and the like represent respective stretchable circuit boards 100 used for measurement.

As illustrated in FIGS. 6A and 6B, in the case of the stretchable circuit board 100 according to the present exemplary embodiment, the maximum resistance value (indicated as "Max" in the drawing) and the minimum resistance value (indicated as "Min" in the drawing) are lower than those of the known configuration. In addition, the resistance value of the average (indicated as "AVG" in the drawing) is slightly lower than that of the known configuration.

It is considered that the results of the measurements are due to the fact that the stretchable wiring portion 55 according to the present exemplary embodiment is a seamless wiring made out of a series of layers formed through the same process from the joining portion with the external terminal 31 to the stretchable electrode 57.

Furthermore, in the case of the stretchable wiring portion 55 according to the present exemplary embodiment, the adhesive enhancing layer 35 is formed on the main surface 33b. The adhesive enhancing layer 35 is made of the same material as that of the porous stretchable base 53. Thus, the present inventor confirmed that no exuding of the stretchable wiring portion 55 occurs on the main surface 33b after the film base 33 is joined with the stretchable base 53, and the clear pattern of the stretchable wiring portion 55 can be obtained. Thus, the stretchable circuit board 100 according to the present exemplary embodiment can obtain clear and stable signals with reduced noise of the signals.

(Method for Manufacturing Biological Sensor Sheet)

In the case of the present exemplary embodiment, the stretchable electrode 57 functions as a bio-electrode. Thus, in the case of the present exemplary embodiment, the stretchable wiring portion 55 that is to be connected with the bio-electrode through which electrical signals are input from a living body is formed on the main surface 53a of the stretchable base 53, and hence, the stretchable circuit board 100 can be used as a biological sensor sheet.

The biological sensor sheet is used in a manner such that the stretchable base 53 is affixed on a living body. The stretchable base 53 stretches in association with protrusions and depressions or movement of the surface of the living body due to its stretchability, and electrical signals obtained from the living body are input into the stretchable electrode 57. The living body includes, for example, a human, and the biological sensor sheet is affixed on, for example, arms or legs of the human to detect signals indicating movement of muscles. Alternatively, the biological sensor sheet is affixed on the forehead or head portion of the human to detect signals indicating works of the brain. Such a biological sensor sheet does not block movement of the living body, and reduces loads on the living body caused by attachment, whereby it is possible to reduce stresses applied on the living body.

It should be noted that the present invention should not be limited to the exemplary embodiment described above, and various changes, improvements or other modes should be included, provided that the object of the present invention is achieved.

For example, the stretchable circuit board 100 may be provided with an affixing layer (not illustrated) for attaching the stretchable circuit board 100 on the surface of a human body. Depending on applications of the stretchable circuit board 100, the affixing layer may be provided on the upper surface side of the stretchable circuit board 100, or may be provided on the lower surface side. The affixing layer may be made from a gel agent or pressure-sensitive adhesive.

Each constituent element of the stretchable circuit board 100 according to the present invention needs not exist separately. It may be possible to employ, for example, a configuration in which plural constituent elements are formed as one member, a configuration in which one constituent element is formed by plural members, a configuration in which one constituent element forms a part of another constituent element, and a configuration in which a part of one constituent element overlaps with a part of another constituent element.

The exemplary embodiment described above includes the following technical ideas.

(1) A method for manufacturing a stretchable circuit board, including:
forming a terminal portion on a main surface located on one side of a first sheet member;
forming a stretchable wiring portion on a main surface located on one side of a second sheet member having stretchability higher than that of the first sheet member; and
connecting the terminal portion and the stretchable wiring portion by positioning the terminal portion and the stretchable wiring portion, and applying pressure and heat to the first sheet member and the second sheet member to join them.

(2) The method for manufacturing a stretchable circuit board according to (1), in which a thermal shrinkage rate of the first sheet member differs from that of the second sheet member.

(3) The method for manufacturing a stretchable circuit board according to (1) or (2), in which the stretchable wiring portion is connected with a bio-electrode through which an electrical signal is inputted from a living body.

(4) A stretchable circuit board including:
a first sheet member including a first main surface having a terminal portion formed thereon;
a second sheet member having stretchability higher than that of the first sheet member and also having a stretchable wiring portion connected with the terminal portion, the stretchable wiring portion being located on a main surface of the second sheet member facing the main surface of the first sheet member, the second sheet member being joined with the first sheet member, in which
the stretchable wiring portion is a series of layers from the terminal portion to an area on the second sheet member that does not overlap with the first sheet member, and the stretchable wiring portion has a constant width when viewed from above.

EXPLANATION OF REFERENCE CHARACTERS 30 reinforcement area
31 external terminal
31a to 31j terminal portion
33 film base
33a, 33b main surface
35 adhesive enhancing layer
37 reinforcing member
50 stretchable area
53 stretchable base
53a, 53b main surface
55, 95 stretchable wiring portion
55a to 55f wiring portion
57 stretchable electrode
91 draw-out wiring
100 stretchable circuit board
300 film base sheet
311, 511 pin hole
313, 513 pattern
500 stretchable base sheet
W width

The invention claimed is:

1. A stretchable circuit board comprising:
a first sheet member including a first main surface having a terminal portion formed thereon;
a second sheet member having a main surface and stretchability higher than that of the first sheet member, and joined to the first sheet member;
the main surface of the second sheet member opposed to the main surface of the first sheet member includes a stretchable wiring portion which is a printed pattern including a resin binder and a conductive material, wherein the stretchable wiring portion directly contacts the terminal portion between the first sheet member and the second sheet member, and
wherein the stretchable wiring portion is a series of layers from the terminal portion to an area on the second sheet member that does not overlap with the first sheet member, and the stretchable wiring portion has a constant width when viewed from above.

2. A method for manufacturing a stretchable circuit board, comprising:
forming a terminal portion on a main surface located on one side of a first sheet member;
forming a stretchable wiring portion including a resin binder and a conductive material on a main surface located on one side of a second sheet member having stretchability higher than that of the first sheet member by printing; and
mechanically and electrically connecting the terminal portion and the stretchable wiring portion by positioning the terminal portion and the stretchable wiring portion, and
applying pressure and heat to the first sheet member and the second sheet member to join the main surface of the first sheet member to the main surface of the second sheet member such that the stretchable wiring portion is thermally fused to directly contact the terminal portion between the first sheet member and the second sheet member.

3. The method for manufacturing a stretchable circuit board according to claim 2, wherein
a thermal shrinkage rate of the first sheet member differs from that of the second sheet member.

4. The method for manufacturing a stretchable circuit board according to claim 2, wherein
the stretchable wiring portion is connected with a bio-electrode through which an electrical signal is inputted from a living body.

* * * * *